(12) United States Patent
Ezzeddine

(10) Patent No.: US 7,952,458 B2
(45) Date of Patent: May 31, 2011

(54) BALUN WITH A 1/4 IMPEDANCE RATIO

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 574 days.

(21) Appl. No.: 11/605,897

(22) Filed: Nov. 29, 2006

(65) Prior Publication Data

US 2007/0120637 A1    May 31, 2007

(30) Foreign Application Priority Data

Nov. 30, 2005    (FR) .................................... 05/53648

(51) Int. Cl.
*H01F 5/00* (2006.01)
*H01F 27/28* (2006.01)
*H01L 27/08* (2006.01)

(52) U.S. Cl. .................. 336/200; 336/232; 257/531

(58) Field of Classification Search .................. 336/200, 336/232; 257/531
See application file for complete search history.

(56) References Cited

U.S. PATENT DOCUMENTS

| | | | |
|---|---|---|---|
| 3,999,150 | A | 12/1976 | Caragliano et al. |
| 5,818,308 | A | 10/1998 | Tanaka et al. |
| 6,396,362 | B1 | 5/2002 | Mourant et al. |
| 6,765,455 | B1 | 7/2004 | De Lillo et al. |
| 2003/0080827 | A1 | 5/2003 | Chominski |
| 2003/0151881 | A1 | 8/2003 | Yue |
| 2004/0012474 | A1 * | 1/2004 | Hwu et al. ..................... 336/200 |
| 2004/0130427 | A1 * | 7/2004 | Ezzeddine ..................... 336/222 |
| 2004/0182602 | A1 | 9/2004 | Satoh et al. |
| 2004/0222861 | A1 * | 11/2004 | Mondal et al. ............ 331/117 R |
| 2005/0052257 | A1 | 3/2005 | Ezzeddine |
| 2005/0264273 | A1 | 12/2005 | Ezzedine |
| 2006/0087384 | A1 | 4/2006 | Ezzedine |
| 2007/0120622 | A1 | 5/2007 | Ezzeddine |
| 2007/0296519 | A1 | 12/2007 | Ezzeddine |

FOREIGN PATENT DOCUMENTS

JP    2003018039 A    1/2003

OTHER PUBLICATIONS

French Search Report dated Feb. 16, 2007 from corresponding French Application No. 06/52586.

(Continued)

*Primary Examiner* — Elvin G Enad
*Assistant Examiner* — Tszfung Chan
(74) *Attorney, Agent, or Firm* — Lisa K. Jorgenson; William R. McClellan; Wolf, Greenfield & Sacks, P.C.

(57) ABSTRACT

A mode-switching transformer with a 1-to-4 impedance ratio having a first planar winding formed in a first conductive level from a first differential mode terminal outside of the winding; a second planar winding formed in a second conductive level from a second differential mode terminal outside of the winding; a via of interconnection of the central ends of the first and second windings intended to be connected to ground; and at least one third planar winding in one of the two conductive levels, interdigited with the first or the second winding from a first common-mode terminal outside of the winding, the internal end of the third winding being connected to the via for direct grounding.

18 Claims, 3 Drawing Sheets

OTHER PUBLICATIONS

Noureddine Boulejfen et al: "*Frequency- and Time-Domain Analyses of Nonuniform Lossy Coupled Transmission Lines with Linear and Nonlinear Terminations*" IEEE Transactions on Microwave Theory and Techniques, IEEE Serice Center, Piscataway, NJ, US, vol. 48, No. 3,. Mar. 2000, XPO11037904 pp. 367-379.

Ohba Y et al: "*Directional Coupler With Coupled Nonuniform Transmission Line Represented By Lumped Brune Section and Uniform Transmission Line*", Electronics & Communications in Japan, Part III—Fundamental Electronic Science, Wiley, Hoboken, NJ, US, vol. 80, No., Apr. 4, 1997, pp. 71-81, XPOO0723465.

French Search Report from corresponding French Application No. 05/53648, filed Nov. 30, 2005.

French Search Report from corresponding French Application No. 05/53652, filed Nov. 30, 2005.

* cited by examiner

BALUN WITH A 1/4 IMPEDANCE RATIO

BACKGROUND OF THE INVENTION

1. Field of the Invention

The present invention relates to the field of mode-switching transformers which are used to convert common-mode signals into differential signals and conversely. Such transformers are generally called "baluns", for balanced-unbalanced.

The present invention more specifically relates to the forming of a balun having a one quarter or 1 (common mode) to 4 (differential mode) impedance ratio, noted 1/4, by using a thin layer technology in electronic circuit applications.

The present invention, for example, applies to the field of radio frequency transmissions and of mobile telephony.

2. Discussion of the Related Art

FIG. 1 illustrates the terminals of a balun 1 of the type to which the present invention applies. Balun 1 comprises a first terminal 2 intended to receive or to provide a common-mode signal UNBAL and two differential-mode accesses 3 and 4 intended to provide or to receive differential signals BAL1 and BAL2. A voltage Vc applied on the common-mode side (for example, a signal referenced to ground and originating from an antenna) is converted into two differential voltages V1 and V2 on differential-mode terminals 3 and 4, referenced to ground 5 (identical or not to ground) of the electronic circuit.

Baluns can be divided in two categories: baluns with local elements formed of inductive and capacitive elements associated in a specific electric assembly and baluns with coupled lines formed of conductive lines forming inductive elements of a transformer. The present invention applies to the second category, that is, to mode-switching transformers in a coupled-line technology.

FIG. 2 shows the electric diagram of a conventional balun with coupled lines having an impedance ratio different from one (for example, 1/4).

Such a balun with a 1/4 ratio is intended for circuits in which the impedance on the differential side (block 13, Zdiff1 connecting access 3 to ground and block 14 Zdiff2 connecting access 4 to ground) is four times greater than the impedance (block 12, Zin) on the common-mode side. In fact, with impedance values Zdiff1 and Zdiff2 (for example, 100 ohms), each of which is equal to twice impedance Zin (for example, 50 ohms), a 1/4 balun is needed (50/200) for the circuit to be impedance-matched without requiring additional adapters.

A mode-switching transformer with coupled lines comprises, on the primary side (common mode), a conductive line 23 defining an inductance L3 and, on the secondary side (differential mode), two conductive lines in series defining inductances L1 and L2 between terminals 3 and 4, junction point 6 between lines 21 and 22 being connected to ground 5. Lines 21 and 22 are coupled to line 23, which is twice as long as each line 21 or 22. The line lengths are a function of the work frequencies of the balun. Generally, lines 21 and 22 have lengths corresponding to one quarter of the wavelength of the central frequency of the bandwidth desired for the balun, line 23 having a length corresponding to half this wavelength.

The impedance ratio of the balun is set by the value of a capacitor C connecting the free end of line 23 to ground 5. For example, for a 1/4 ratio and for a balun sized for a central 2-GHz frequency, a capacitor on the order of 1 pF is required.

A disadvantage is the presence of the capacitor which needs to be adjusted according to the desired impedance ratio.

Another disadvantage of the use of a capacitor to match the impedance ratio is that this makes the mode-switching transformer sensitive to electrostatic discharges, above all in an integrated forming.

Another disadvantage is the capacitor bulk.

Another disadvantage is the complexity of the forming.

SUMMARY OF THE INVENTION

The present invention aims at overcoming all or part of the disadvantages of conventional mode-switching transformers for which a 1-to-4 impedance ratio is desired.

The present invention more specifically aims at avoiding use of a capacitive element to match the impedance ratio.

The present invention also aims at providing a solution compatible with a thin layer technology enabling forming of integrated baluns.

To achieve all or part of these and other objects, the present invention provides a mode-switching transformer with a 1-to-4 impedance ratio comprising a first planar winding formed in a first conductive level from a first differential mode terminal outside of the winding; a second planar winding formed in a second conductive level from a second differential mode terminal outside of the winding; a via of interconnection of the central ends of the first and second windings intended to be connected to ground; and at least one third planar winding in one of the two conductive levels, interdigited with the first or the second winding from a first common-mode terminal outside of the winding, the internal end of the third winding being connected to said via for direct grounding.

According to an embodiment of the present invention, at least one fourth conductive winding, in the conductive level which does not contain the third winding, is interdigited with the second or first winding from an external end, the internal end of the fourth winding being connected to said via for direct grounding.

According to an embodiment of the present invention, the external end of the fourth winding is intended to be left in the air.

According to an embodiment of the present invention, the external end of the fourth winding is intended to be directly connected to ground.

According to an embodiment of the present invention, the respective lengths of the conductive windings are selected to correspond to one quarter of the wavelength of the central frequency of the bandwidth desired for the transformer.

The present invention also provides a method for manufacturing a coupled-line mode-switching transformer, comprising the steps of forming the transformer lines in the form of planar conductive windings in two levels stacked on each other, two windings present in a same plane being interdigited with each other and the central ends of all windings being intended to be directly connected to ground.

The foregoing and other objects, features, and advantages of the present invention will be discussed in detail in the following non-limiting description of specific embodiments in connection with the accompanying drawings.

DETAILED DESCRIPTION

Figure 1:
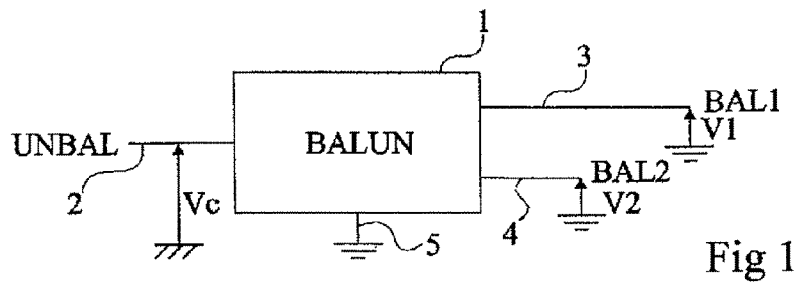
FIG. 1, previously described, shows a mode-switching transformer of the type to which the present invention applies.
Figure 2:
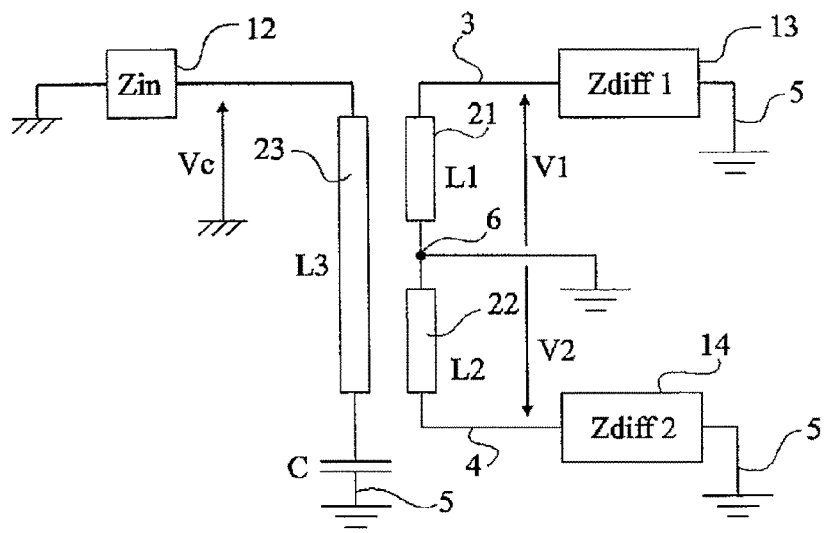
FIG. 2 very schematically shows a conventional example of the forming of a coupled-line mode-switching transformer with an impedance ratio different from 1.

The same elements have been designated with the same reference numerals in the different drawings, which have been drawn out of scale. For clarity, only those elements which are necessary to the understanding of the present invention have been shown in the drawings and will be described hereafter. In particular, the applications of the mode-switching transformer of the present invention have not been described in detail, the transformer of the present invention being usable to replace a conventional transformer in any application. Similarly, the methods for forming thin layers by using integrated circuit manufacturing technologies have not been described in detail, the present invention being compatible with conventional techniques.

A feature of the present invention is to form the coupled lines of the mode-switching transformer in the form of planar conductive windings in two levels stacked on each other, two windings present in a same plane being interdigited with each other.

Figure 3:
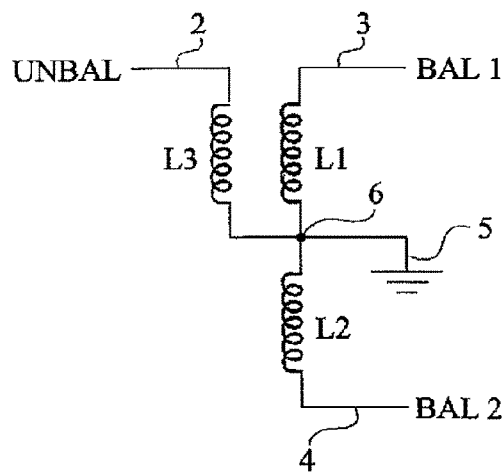
FIG. 3 shows the equivalent electric diagram of a mode-switching transformer with an impedance ratio 1/4 according to a first embodiment of the present invention.
Figure 4A:
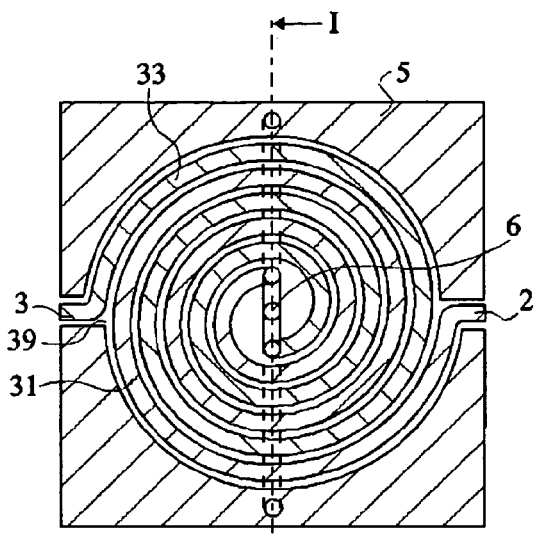
FIGS. 4A, 4B, and 4C are top views of conductive levels taking part in the forming of an integrated mode-switching transformer according to the embodiment of FIG. 3.
Figure 5A:
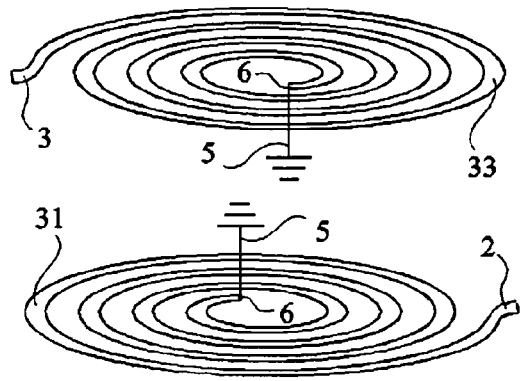
FIGS. 5A and 5B are simplified exploded perspective views illustrating the forming of the coupled lines of FIGS. 4A and 4B.
Figure 4B:
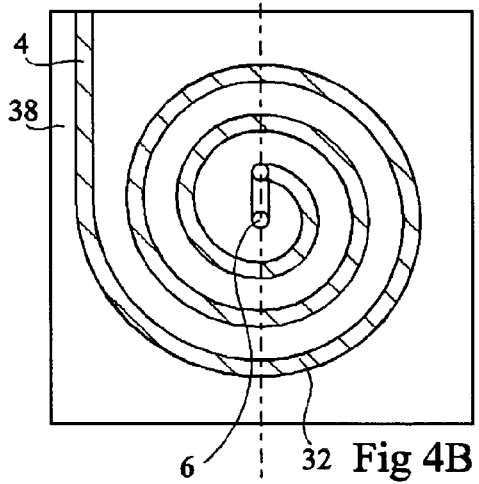
Figure 5B:
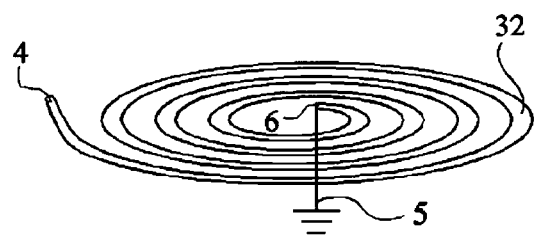
Figure 4C:
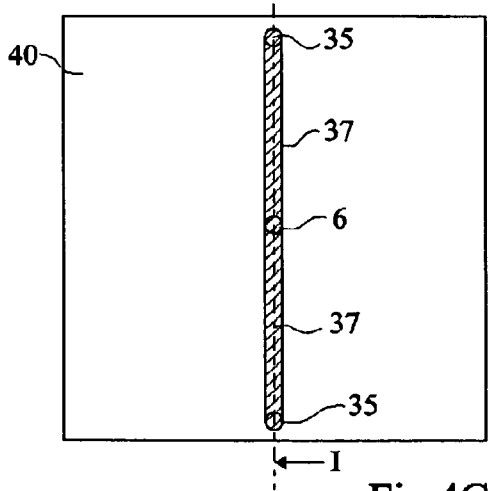
Figure 6:
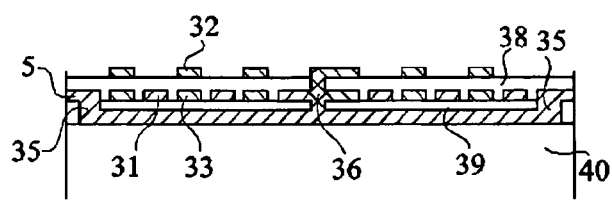
FIG. 6 is a simplified cross-section view of the balun of FIGS. 4A to 4C taken along line I-I.

FIGS. 3, 4A, 4B, 4C, 5A, 5B, and 6 illustrate a first embodiment of a balun with an impedance ratio 1/4 according to the present invention. FIG. 3 is an equivalent electric diagram of the balun. FIGS. 4A, 4B, and 4C are simplified top views of three conductive levels used to form the balun. FIGS. 5A and 5B illustrate in exploded perspective view the respective windings of FIGS. 4A and 4B. FIG. 6 is a cross-section view along line I-I of FIGS. 4A to 4C.

According to this embodiment of the present invention (FIG. 3), a balun comprises on the differential or secondary side two inductive elements L1 and L2 in series between a first differential mode access 3 intended to provide or to receive a signal BAL1 and a second differential-mode access 4 intended to provide or to receive a signal BAL2. Junction point 6 of windings L1 and L2 is connected to ground 5. On the common-mode or primary side, a third inductive element L3 connects a common-mode access 2 intended to provide or receive a signal UNBAL to ground 5. This direct grounding of element L3 is symbolized by a direct connection to junction point 6 of windings L1 and L2.

As illustrated in FIGS. 4A, 4B, 5A, and 5B, inductances L1 and L2 are formed of planar windings 31 and 32 formed in two superposed conductive levels separated by an insulator 38 (FIG. 6). Further, inductive element L3 is formed of a planar winding 33 formed in one of the two metallization levels, in this example, the first level (FIGS. 4A and 5A). Winding 33 is interdigited with winding 31 forming inductive element L1. The external ends of windings 31, 32, and 33 define accesses 2, 3, and 4. The internal ends of windings 31 and 33 are connected to a conductive via 36 (FIG. 6) forming common point 6, for example, at the center of the structure. In the shown example, via 36 joins a third conductive level (FIG. 4C), separated from the first level by an insulating layer 39 (FIG. 6), and in which are formed two rectilinear conductive sections 37 to have central point 6 come out to the outside of the structure and return to the first level (FIG. 4A) by means of conductive vias 35 to contact ground plane 5 formed in this level.

In the shown example, winding 32 winds clockwise, as seen from the top and from the center, while windings 31 and 33 wind in the reverse direction. The opposite is of course possible provided that, starting from one of terminals 3 or 4, the winding direction to the center of winding 31 (respectively 32) is the same as the winding direction of the other differential-mode winding 32 (respectively 31) from the center to the outside. The winding direction of common-mode winding 33 depends on the winding 31 or 32 with which it is interdigited.

The superposition order of the conductive levels is of no importance. For example, the level (FIGS. 4A and 4B) containing ground plane 5 and the two windings 31 and 33 may be an intermediary level above which is present the conductive level (FIGS. 4B and 5B) in which winding 32 is formed and under which is present the level (FIG. 4C) comprising bridges 37 of contact transfer to the outside. The level in which bridges 37 are formed rests for example, on a substrate 40. Substrate 40 may contain other active and/or passive components. Bridges 37 are, preferably, at least two in number for reasons of symmetry of the structure.

According to an alternative embodiment, the ground plane may be formed in the third level (FIG. 4C). In this case, conductive bridges 37 are avoided since it is not necessary to rise up to the first level and the only conductive via is via 36 of the midpoint. The embodiment illustrated in FIGS. 4A to 4C (with bridges 37) is selected, for example, in the case where two metal levels (levels of FIGS. 4A and 4B) and a non-metallic conductive level (partially resistive) incompatible for a ground plane are available.

The fact of stacking up the planar conductive windings of the differential mode on each other and of interdigiting the conductive winding of the common mode with one of the two windings of the differential mode results in the switching of the transformer impedance ratio, by using conductive windings of same length, from 1:1 to 1/4. The fact that the windings of the secondary (differential mode) are stacked up on two conductive levels multiplies the value of the corresponding inductances by four at constant length with respect to the primary winding (common mode) which is formed on a single level.

According to a preferred embodiment of the present invention, the respective lengths of windings 31, 32, and 33 are selected to correspond to one quarter of the wavelength of the central frequency of the bandwidth desired for the balun.

An advantage of the present invention is that it avoids use of a capacitive element to set the impedance ratio.

Another advantage of the present invention is that it is compatible with techniques of forming mode-switching transformers in thin layers by means of planar windings forming coupled lines.

Figure 7:
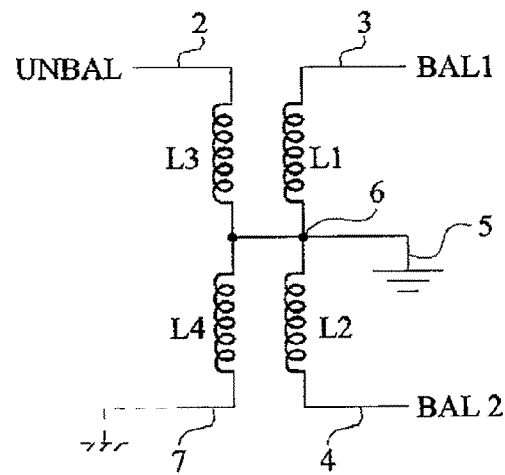
FIG. 7 shows the equivalent electric diagram of a mode-switching transformer with an impedance ratio 1/4 according to a second preferred embodiment of the present invention.
Figure 8A:
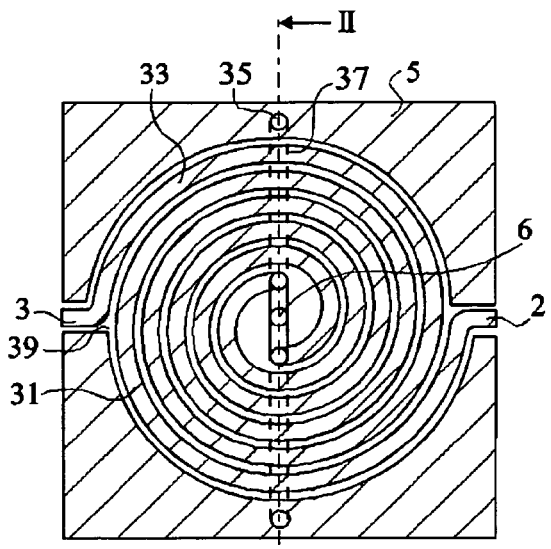
FIGS. 8A, 8B, and 8C are top views of conductive levels taking part in the forming of an integrated mode-switching transformer according to the embodiment of FIG. 7.
Figure 9A:
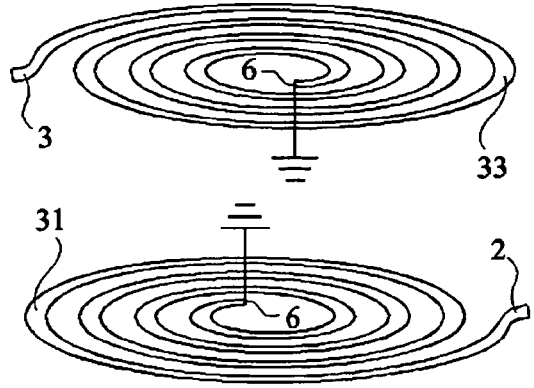
FIGS. 9A and 9B are simplified exploded perspective views illustrating the forming of the coupled lines of FIGS. 8A and 8C.
Figure 8B:
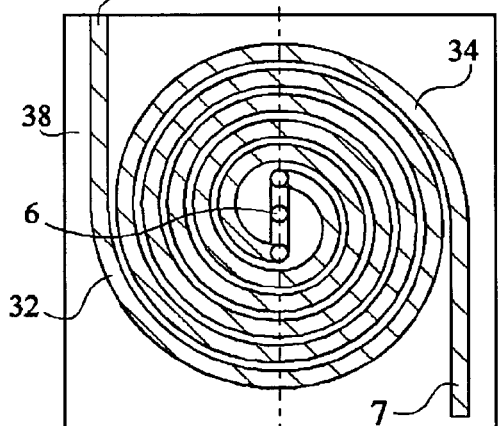
Figure 9B:
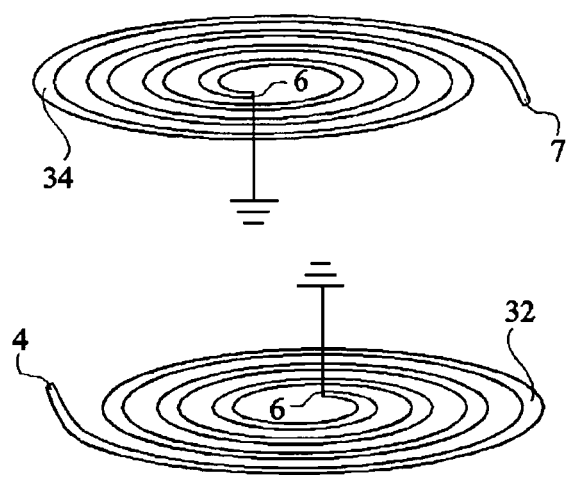
Figure 8C:
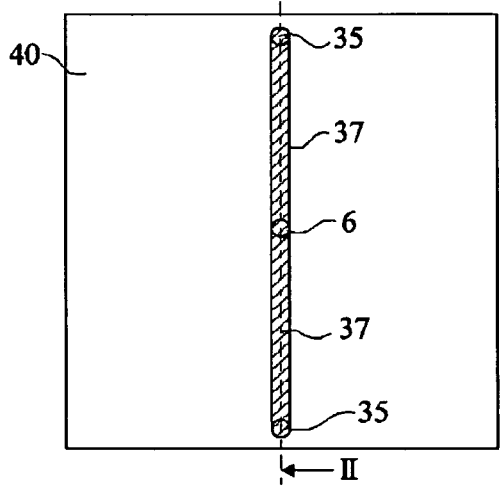
Figure 10:
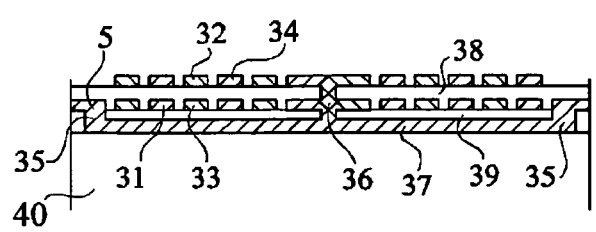
FIG. 10 is a simplified cross-section view of the balun of FIGS. 8A to 8C taken along line II-II.

FIGS. 7, 8A, 8B, 8C, 9A, 9B, and 10 illustrate a second preferred embodiment of a mode-switching transformer with a 1/4 impedance ratio according to the present invention. FIG. 7 is an equivalent electric diagram of the balun. FIGS. 8A, 8B, and 8C are simplified top views of three conductive levels used for the forming of the balun. FIGS. 9A and 9B illustrate in exploded perspective view the respective windings of FIGS. 8A and 8B. FIG. 10 is a cross-section view along line II-II of FIGS. 8A to 8C.

As compared with the first embodiment described with the previous drawings, a fourth planar conductive winding 34 (FIGS. 8A and 9B) is interdigitated with second winding 32 and forms a fourth inductive winding L4 (FIG. 7) in series with element L3, the junction point of the two windings 33 and 34 on the common mode side being grounded (and thus connected to junction point 6). Free end 7 of conductive winding 34 is left floating or is directly grounded (with no capacitor). In other words, conductive winding 34 does not modify the impedance ratio (due to the ground connection of junction point 6) but makes the structure symmetrical.

An advantage is that this improves the phase balance and amplitude balance parameters between the two differential mode accesses.

As in the previous embodiment, the respective lengths of the conductive windings are, preferably, selected to correspond to one quarter of the wavelength of the central frequency of the bandwidth desired for the balun.

In practice all of the windings have substantially the same length although this length may vary as a function of the orientation and location in the plane of the external ends 2, 3, 4 and 7. However the length difference should be less than the length of an external turn of a winding, preferentially less than one quarter of the length of an external turn.

Still as in the previous embodiment, the stacking order of the conductive levels is of little importance and may be selected according to other parameters imposed, for example, by the other circuits connected to the mode-switching transformer.

In the illustrated example, windings 32 and 34 wind clockwise, in top view and from the center, while windings 31 and 33 wind counterclockwise.

The variations discussed in relation with the first embodiment of course apply to the second one.

According to a specific example of an embodiment applied to a 2-GHz work frequency, a balun such as described in relation with FIGS. 8 to 10 may exhibit the following characteristics:
 developed length of windings 31 to 34: 3.5 mm;
 gap between lines: 50 μm;
 width of lines 31 to 34: w=30 μm; and
 thickness of lines 31 to 34: 3 μm.

Of course, the present invention is likely to have various, alterations, improvements, and modifications which will readily occur to those skilled in the art. In particular, the dimensions to be given to the mode-switching transformers (to the length and sections of the lines) depend on the application and are within the abilities of those skilled in the art according to the desired line resistance and to the operating frequency of the balun.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mode-switching transformer with a 1-to-4 impedance ratio comprising:
 a first planar winding formed in a first conductive level from a first differential mode terminal outside of the winding;
 a second planar winding formed in a second conductive level from a second differential mode terminal outside of the winding;
 a via of interconnection of central ends of the first and second windings; and
 at least one third planar winding in one of the two conductive levels, interdigitated with the first or the second winding from a first common-mode terminal outside of the winding, a central end of the third winding being connected to said via wherein outside ends of the first, second and third planar windings are connected to the first differential mode terminal, the second differential mode terminal and the first common-mode terminal, respectively, at least one fourth planar winding, in the conductive level which does not contain the third planar winding, being interdigitated with the second or first planar winding from an external end, a central end of the fourth planar winding being connected to said via, wherein the external end of the fourth planar winding is unconnected and wherein the central ends of the first, second, third and fourth planar windings are connected to said via for direct grounding.

2. The transformer of claim 1, wherein the respective lengths of the conductive windings are selected to correspond to one quarter of the wavelength of the central frequency of the bandwidth desired for the transformer.

3. A method for manufacturing a coupled-line mode-switching transformer, comprising the steps of forming transformer lines as of planar conductive windings in two levels stacked on each other, two windings in a same level being interdigitated with each other and central ends of all windings being intended to be directly connected to ground, the planar conductive windings including first, second, third and fourth planar windings interconnected at their central ends for connection to ground, the fourth planar winding being interdigitated with the second planar winding in the second conductive level, an external end of the fourth planar winding being unconnected.

4. A mode-switching transformer comprising:
 a first planar winding in a first conductive level on a substrate, the first planar winding having a first differential mode terminal at an external end thereof;
 a second planar winding in a second conductive level on the substrate, the second planar winding having a second differential mode terminal at an external end thereof;
 a third planar winding interdigitated with the first planar winding in the first conductive level, the third planar winding having a common mode terminal at an external end thereof;
 a fourth planar winding interdigitated with the second planar winding in the second conductive level, an external end of the fourth planar winding being unconnected; and
 a via interconnecting internal ends of the first, second, third and fourth planar windings for connection to ground, wherein the third and fourth planar windings form a common mode side of the transformer, and the first and second planar windings form a differential side of the transformer.

5. A mode-switching transformer as defined in claim 4, wherein the first, second and third planar windings are configured to provide a 1-to-4 impedance ratio.

6. A mode-switching transformer as defined in claim 4, wherein respective lengths of the first, second and third planar windings correspond to one quarter of the wavelength of a central frequency of the bandwidth of the transformer.

7. A mode-switching transformer as defined in claim 4, further comprising an insulating layer between the first and second conductive levels.

8. A mode-switching transformer as defined in claim 4, wherein the first and second planar windings wind in opposite directions.

9. A mode-switching transformer as defined in claim 4, further comprising a third conductive level connected to the via.

10. A mode-switching transformer as defined in claim 4, wherein the first conductive level serves as a ground plane.

11. A mode-switching transformer as defined in claim 4, wherein the first, second and third planar windings have a length difference less than one quarter of a length of an external turn of the windings.

12. A method for manufacturing a mode-switching transformer, comprising:
 forming a first planar winding in a first conductive level on a substrate;
 forming a second planar winding in a second conductive level on the substrate;
 forming a third planar winding interdigitated with the first planar winding in the first conductive level;
 forming a fourth planar winding interdigitated with the second planar winding in the second conductive level, an external end of the fourth planar winding being unconnected; and
 interconnecting internal ends of the first, second third and fourth planar windings for connection to ground, wherein outside ends of the first, second and third planar windings are connected to a first differential mode terminal, a second differential mode terminal and a first common-mode terminal, respectively, of the mode-switching transformer, wherein the third and fourth planar windings form a common mode side of the transformer, and the first and second planar windings form a differential side of the transformer.

13. A method as defined in claim 12, further comprising forming the first, second and third planar windings to have a 1-to-4 impedance ratio.

14. A method as defined in claim 12, further comprising forming an insulating layer between the first and second conductive levels.

15. A method as defined in claim 12, further comprising forming the first and second planar windings to wind in opposite directions.

16. A method as defined in claim 12, further comprising forming a third conductive level and interconnecting the internal ends of the first, second and third planar windings to the third conductive level.

17. A method as defined in claim 12, further comprising forming a ground plane in the first conductive level.

18. A method as defined in claim 12, further comprising forming the first, second and third planar windings having a length difference less than one quarter of a length of an external turn of the windings.

* * * * *